United States Patent
Feyh

(12) 
(10) Patent No.: US 7,923,794 B2
(45) Date of Patent: Apr. 12, 2011

(54) MICROMECHANICAL COMPONENT HAVING THIN-LAYER ENCAPSULATION AND PRODUCTION METHOD

(75) Inventor: Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 355 days.

(21) Appl. No.: 12/152,332

(22) Filed: May 13, 2008

(65) Prior Publication Data

US 2008/0296747 A1    Dec. 4, 2008

(30) Foreign Application Priority Data

May 14, 2007  (DE) .......................... 10 2007 022 509

(51) Int. Cl.
*H01L 29/82* (2006.01)
(52) U.S. Cl. .................... 257/415; 438/50; 257/E21.613
(58) Field of Classification Search .................. 257/415, 257/419, 420, E21.613; 438/50, 52
See application file for complete search history.

(56) References Cited

U.S. PATENT DOCUMENTS

| 6,165,890 | A | 12/2000 | Kohl et al. | |
|---|---|---|---|---|
| 7,429,495 | B2 * | 9/2008 | Wan | 438/53 |
| 7,670,861 | B2 * | 3/2010 | Hanaoka et al. | 438/53 |

FOREIGN PATENT DOCUMENTS

| EP | 0 410 108 | 1/1991 |
|---|---|---|
| WO | WO 2007/078495 | 7/2007 |

* cited by examiner

*Primary Examiner* — Quoc D Hoang
(74) *Attorney, Agent, or Firm* — Kenyon & Kenyon LLP

(57) ABSTRACT

A micromechanical component having a substrate and having a thin-layer, as well as having a cavity which is bounded by the substrate and the thin-layer, at least one gas having an internal pressure being enclosed in the cavity. The gas phase has a non-atmospheric composition. A method for producing a micromechanical component having a substrate and having a thin-layer encapsulation, as well as having a cavity which is bounded by the substrate and the thin-layer encapsulation. The method has the steps of positioning a polymer in a cavity, closing the cavity and generating a gas phase of non-atmospheric composition in the cavity by decomposing at least a part of the polymer. An internal pressure is generated, which may be higher than the process pressure when the cavity is closed.

14 Claims, 2 Drawing Sheets

MICROMECHANICAL COMPONENT HAVING THIN-LAYER ENCAPSULATION AND PRODUCTION METHOD

FIELD OF THE INVENTION

The present invention relates to a micromechanical component having a substrate and having a thin-layer encapsulation, as well as having a cavity which is bounded by the substrate and the thin-layer encapsulation, at least one gas having an internal pressure being enclosed in the cavity.

BACKGROUND INFORMATION

For sensors encapsulated by a thin layer, because of the production process, the process pressure of the enclosing process (as a rule, a few mbar) is enclosed. The method of seal glass encapsulation makes possible a pressure enclosure by the atmosphere used in the encapsulation.

Many sensors, such as acceleration sensors, require a high enclosed pressure for their operation. This is not implemented easily using the processes involving a thin-layer cap.

It is described in European Patent No. EP 04 101 108 that, in addition to the process gas, one may also enclose an additional inert gas in a sensor encapsulated using a thin layer.

SUMMARY OF THE INVENTION

The present invention relates to a micromechanical component, having a substrate and having a thin-layer, as well as having a cavity which is bounded by the substrate and the thin layer, at least one gas having an internal pressure being enclosed in the cavity. A crux of the present invention is that the gas phase has a non-atmospheric composition.

The internal pressure is advantageously greater than ca. 100 mbar. The internal pressure is especially advantageously greater than ca. 1000 mbar.

One advantageous embodiment of the micromechanical component provides that a micromechanical structure is situated in the cavity. This micromechanical structure may advantageously be damped mechanically by the gas phase.

One advantageous embodiment of the micromechanical component provides that the thin layer is a deflectable diaphragm. In that way, a pressure sensor may advantageously be created whose working range may be adjusted by the internal pressure of the gas phase.

One advantageous embodiment of the micromechanical component provides that a polymer is enclosed in the cavity. The non-atmospheric gas phase is able to be generated advantageously by the polymer.

The present invention also relates to a method for producing a micromechanical component having a substrate and having a thin-layer encapsulation, as well as having a cavity which is bounded by the substrate and the thin-layer encapsulation. The method according to the present invention has the steps of positioning a polymer in a cavity, closing the cavity and generating a gas phase of non-atmospheric composition in the cavity by decomposing at least a part of the polymer. An internal pressure is generated, according to the present invention, which may be higher than the process pressure when the cavity is closed. The polymer is advantageously decomposed thermally.

Using the present invention, a method is provided whereby an arbitrary internal pressure is able to be implemented in a cavity which is closed using a thin-layer cap. Using a polymer situated in the cavity, for instance, in the form of a polymer layer, which is converted, after the completion and the closing of the cap, to a gas or a gas mixture, a specified internal pressure is able to be enclosed within the cavity. This pressure is given by the volume of the polymer. By contrast, in usual enclosing processes, this pressure is limited to the process pressure that is being used for the enclosing.

A gas phase is created by the decomposition having a non-atmospheric composition. Inert gases, such as $CO_2$, CO, and short-chain $C_xH_yO_z$ are created. The method provided here also makes possible pressures in excess of 1 atmosphere. This cannot be implemented using any other method. Because of this, very powerful damping is able to be set for mechanical structures situated in the cavity.

DETAILED DESCRIPTION

Figure 1A:
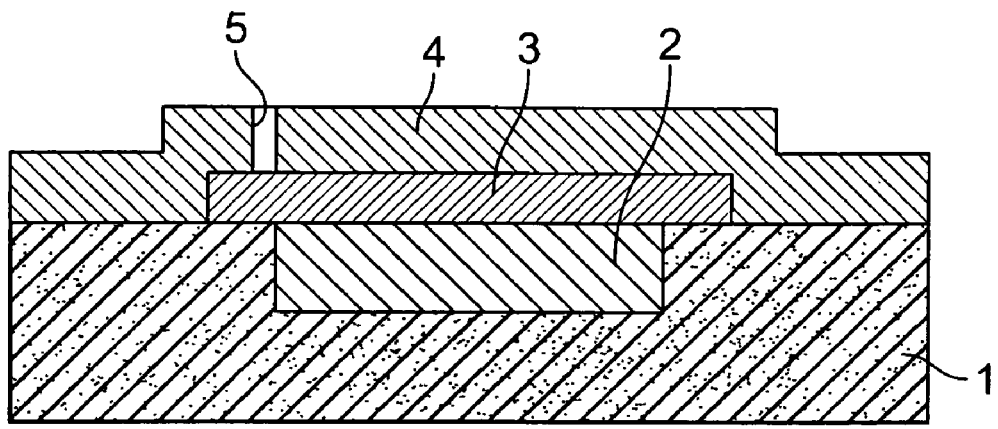
FIGS. 1a and 1b show schematically a sensor of the related art that is encapsulated using a thin layer.
Figure 1B:
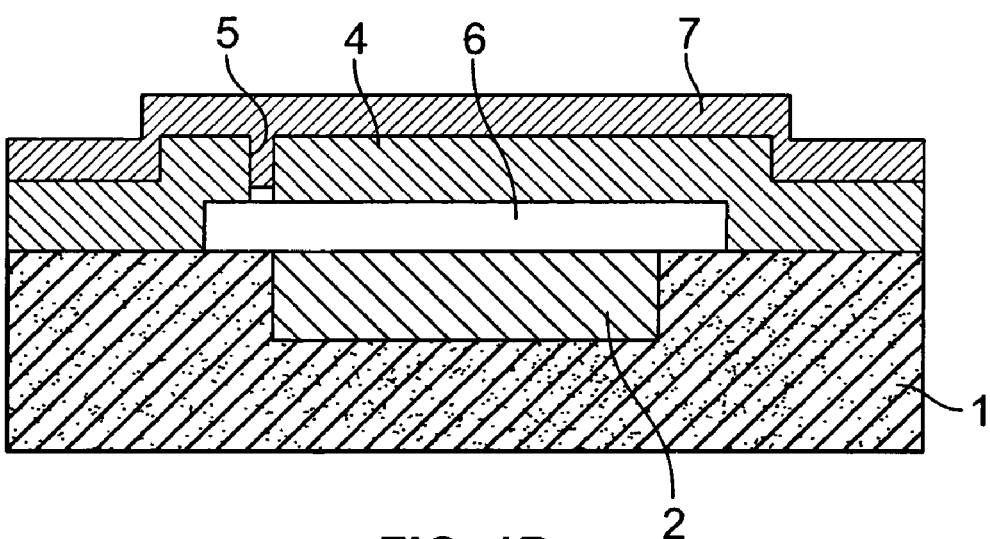

FIGS. 1a and 1b show schematically a sensor encapsulated using a thin layer, according to the related art. FIG. 1a shows a substrate 1 having a recess into which a sensor structure 2 has been inserted. Above this, there is a sacrificial layer 3, which defines the distance of sensor structure 2 from a thin-layer encapsulation 4. In thin-layer encapsulation 4, openings 5 have been inserted through which sacrificial layer 3 may be etched. In FIG. 1b this sacrificial layer 3 has been etched away, and using a closing layer 7, the etching accesses in the form of openings 5 have been sealed. In addition, in cavity 6, a gas phase is enclosed having the process pressure, which was applied in response to the deposition of closing layer 7. This gas phase typically contains Ar or also $N_2$ as important components. The process pressure typically amounts to a few 10 mbar. This process pressure represents the operating pressure of the sensor and, at the same time, influences its properties, among other things, concerning its damping.

Figure 2A:
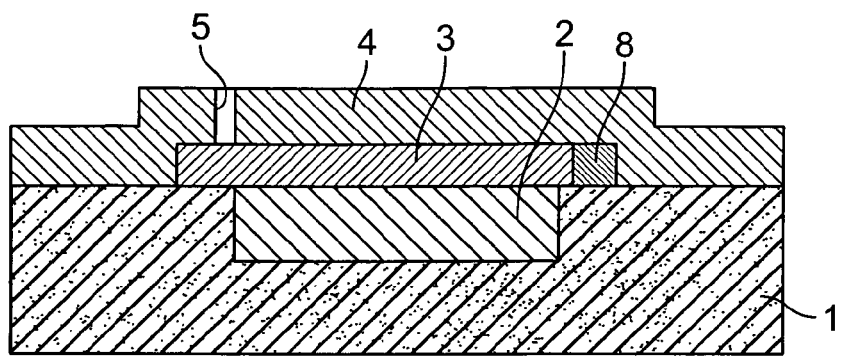
FIGS. 2a, 2b and 2c show schematically a micromechanical component according to the present invention, having thin-layer encapsulation.
Figure 2B:
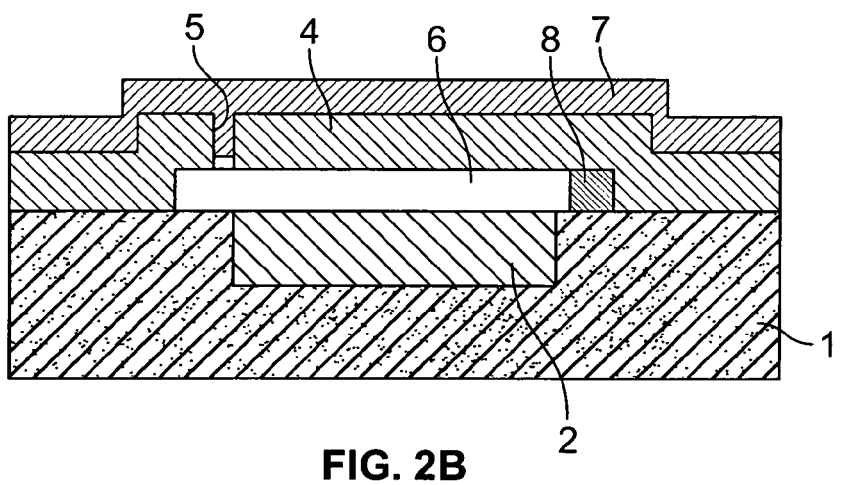
Figure 2C:
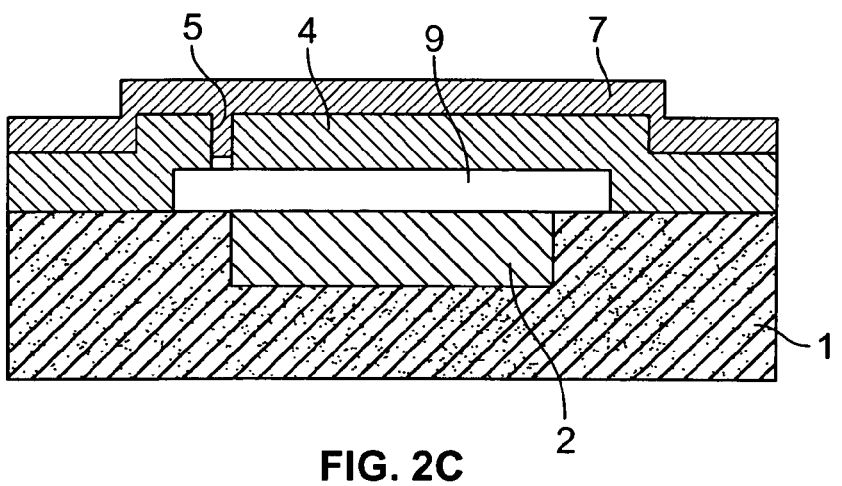

FIGS. 2a, 2b and 2c schematically show a micromechanical component, according to the present invention, having thin-layer encapsulation. The micromechanical component according to FIG. 2a corresponds to the one shown in FIG. 1a. However, in this case, besides sacrificial layer 3, a polymer 8 is inserted, which is able to be converted irreversibly into a gas phase by a tempering step. In a next step, according to FIG. 2b and similarly to FIG. 1b, sacrificial layer 3 is etched and then openings 5 in encapsulating layer 4 are closed. The process pressure temporarily sets in again in cavity 6. Polymer 8 is still intact.

In a subsequent step, polymer 8 is at least partially thermally decomposed. In FIG. 2c polymer 8 is fully decomposed. It is also possible for the polymer to be only partially decomposed. In the use of thermally decomposable polymers, temperatures about 430° C. are required. A gas phase 9 is created by the decomposition having a non-atmospheric composition. Inert gases, such as $CO_2$, CO, and short-chain $C_xH_yO_z$ are created, for example. Since an enormous volume increase is involved with this process, a clearly higher internal pressure 9 is able thereby to be enclosed in the cavity. Depending on the volume of polymer block 8 and the decomposed proportion, this pressure may be set in a specified manner. In this connection, pressures of clearly more than one bar (in excess of 1000 mbar) are possible.

Gas phase 9 has a non-atmospheric composition, according to the present invention. A non-atmospheric composition means that gas phase 9 has a different composition of substances than the atmosphere which is present upon the closing of thin-layer encapsulation 4 using closing layer 7, in the surroundings of the micromechanical component, that is, in the process chamber. As explained above, said atmosphere typically contains as essential component Ar or even $N_2$.

Gas phase 9 also has a higher pressure, according to the present invention, than the pressure of the atmosphere that is present upon the closing of thin-layer encapsulation 4 using closing layer 7, in the surroundings of the micromechanical component.

Gas phase 9 is composed in one part of the atmosphere that is present when closing layer 7 is formed, and in a further part of the decomposition products of polymer 8. At high internal pressures, gas phase 9 is made up in the largest part of the decomposition products of polymer 8.

What is claimed is:

1. A micromechanical component comprising:
   a substrate;
   a thin-layer encapsulation;
   a cavity bounded by the substrate and the thin-layer encapsulation, the cavity enclosing at least one gas phase having an internal pressure, the gas phase having a non-atmospheric composition, which is a different composition than an atmosphere surrounding the micromechanical component; and
   a polymer enclosed in the cavity, wherein the polymer is converted irreversibly to the gas phase.

2. The micromechanical component according to claim 1, wherein the internal pressure is greater than about 100 mbar.

3. The micromechanical component according to claim 1, wherein the internal pressure is greater than 1000 mbar.

4. The micromechanical component according to claim 1, further comprising a micromechanical structure situated in the cavity.

5. The micromechanical component according to claim 1, wherein the thin-layer encapsulation is a deflectable diaphragm.

6. The micromechanical component according to claim 1, wherein the gas phase comprises at least one of inert gases, $CO_2$, CO, or short-chain $C_xH_yO_z$.

7. The micromechanical component according to claim 1, wherein the polymer is at least partially thermally decomposed.

8. The micromechanical component according to claim 7, wherein the polymer is fully decomposed.

9. The micromechanical component according to claim 8, wherein the internal pressure is determined by at least one of (i) a volume of the polymer and (ii) a proportion of decomposition of the polymer.

10. The micromechanical component according to claim 1, wherein the gas phase of non-atmospheric composition is generated by the polymer.

11. The micromechanical component according to claim 1, wherein the polymer is a polymer layer.

12. The micromechanical component according to claim 1, wherein the polymer is converted by tempering.

13. A method for producing a micromechanical component having a substrate, a thin-layer encapsulation and a cavity bounded by the substrate and the thin-layer encapsulation, the method comprising:
    positioning a polymer in the cavity;
    closing the cavity; and
    generating a gas phase having a non-atmospheric composition in the cavity by decomposing at least a part of the polymer.

14. The method according to claim 13, wherein the polymer is decomposed thermally.

* * * * *